US012317450B1

(12) United States Patent
Blackmon et al.

(10) Patent No.: US 12,317,450 B1
(45) Date of Patent: May 27, 2025

(54) FLUID CIRCULATION SYSTEMS AND METHODS FOR COOLING HAVING A COLLECTOR

(71) Applicant: Rhodium Technologies LLC, Rockdale, TX (US)

(72) Inventors: Chase Blackmon, Rockdale, TX (US); William Boardman, Rockdale, TX (US)

(73) Assignee: Rhodium Technologies LLC, Rockdale, TX (US)

( * ) Notice: Subject to any disclaimer, the term of this patent is extended or adjusted under 35 U.S.C. 154(b) by 269 days.

(21) Appl. No.: 17/982,333

(22) Filed: Nov. 7, 2022

Related U.S. Application Data

(60) Provisional application No. 63/277,160, filed on Nov. 8, 2021.

(51) Int. Cl.
*H05K 7/20* (2006.01)
*G06F 1/20* (2006.01)

(52) U.S. Cl.
CPC ......... *H05K 7/20272* (2013.01); *G06F 1/206* (2013.01); *H05K 7/20236* (2013.01); *H05K 7/20263* (2013.01)

(58) Field of Classification Search
CPC .. H05K 7/20; H05K 7/20236; H05K 7/20263; H05K 7/20272; H05K 7/203;
(Continued)

(56) References Cited

U.S. PATENT DOCUMENTS 3,406,244 A 10/1968 Oktay
4,072,188 A 2/1978 Wilson et al.
(Continued)

FOREIGN PATENT DOCUMENTS

JP H04116758 U 4/1992
RU 2500013 11/2013
(Continued)

OTHER PUBLICATIONS

P. E. Tuma, "The merits of open bath immersion cooling of datacom equipment," 2010 26th Annual IEEE Semiconductor Thermal Measurement and Management Symposium (SEMI[1]THERM), 2010, pp. 123-131, doi: 10.1109/STHERM.2010.5444305.
(Continued)

*Primary Examiner* — Amir A Jalali
(74) *Attorney, Agent, or Firm* — McDonnell Boehnen Hulbert & Berghoff LLP

(57) ABSTRACT

A fluid circulation system for cooling a plurality of computing devices with a dielectric fluid includes a fluid tank, a cooler, and a collector. The fluid tank includes a bottom having a plurality of apertures for receiving the dielectric fluid. The fluid tank is configured to hold the plurality of computing devices with a first computing device of the plurality of computing devices disposed over a first group of the apertures of the plurality of apertures. The cooler is configured to receive the dielectric fluid and remove thermal energy from the dielectric fluid. The collector includes a first cavity, a second cavity, a plate separating the first cavity from the second cavity, a collector inlet that opens into the first cavity and is configured to supply dielectric fluid into the collector, and a collector outlet. The fluid tank, cooler, and collector are fluidly connected in a fluid circuit.

20 Claims, 9 Drawing Sheets

(58) Field of Classification Search
CPC ........... H05K 7/20318; H05K 7/20327; H05K 7/20772; H05K 7/208; H05K 7/20809; H05K 7/20818; G06F 1/20; G06F 1/206; B01D 18/0031; B01D 35/18; F25D 3/005; F28D 15/00; F28F 13/00; F01P 11/028

See application file for complete search history.

(56) References Cited

U.S. PATENT DOCUMENTS

| | | |
|---|---|---|
| 4,453,197 A | 6/1984 | Burrage |
| 4,590,538 A | 5/1986 | Cray |
| 4,870,243 A | 9/1989 | Wilson et al. |
| 5,167,511 A | 12/1992 | Krajewski et al. |
| 5,293,754 A | 3/1994 | Mizuno |
| 5,448,108 A | 9/1995 | Quon et al. |
| 6,019,167 A | 2/2000 | Bishop et al. |
| 6,535,382 B2 | 3/2003 | Bishop et al. |
| 6,555,298 B1 | 4/2003 | Rolfson |
| 6,776,707 B2 | 8/2004 | Koplin |
| 7,200,007 B2 | 4/2007 | Yasui et al. |
| 7,280,356 B2 | 10/2007 | Pfahnl et al. |
| 7,318,322 B2 | 1/2008 | Ota et al. |
| 7,403,392 B2 | 7/2008 | Attlesey et al. |
| 7,414,845 B2 | 8/2008 | Attlesey et al. |
| 7,433,188 B2 | 10/2008 | Miller |
| 7,724,517 B2 | 5/2010 | Attlesey et al. |
| 7,724,524 B1 | 5/2010 | Campbell et al. |
| 7,905,106 B2 | 3/2011 | Attlesey |
| 7,911,782 B2 | 3/2011 | Attlesey et al. |
| 7,911,793 B2 | 3/2011 | Attlesey |
| 8,009,419 B2 | 8/2011 | Attlesey |
| 8,014,150 B2 | 9/2011 | Campbell et al. |
| 8,035,972 B2 | 10/2011 | Ostwald et al. |
| 8,089,764 B2 | 1/2012 | Attlesey |
| 8,089,765 B2 | 1/2012 | Attlesey |
| 8,089,766 B2 | 1/2012 | Attlesey |
| 8,305,759 B2 | 11/2012 | Attlesey et al. |
| 8,369,090 B2 | 2/2013 | Chester et al. |
| 8,467,189 B2 | 6/2013 | Attlesey |
| 8,654,529 B2 | 2/2014 | Attlesey |
| 8,724,322 B2 | 5/2014 | Rinke |
| 9,051,502 B2 | 6/2015 | Sedarous et al. |
| 9,086,859 B2 | 7/2015 | Attlesey |
| 9,128,681 B2 | 9/2015 | Attlesey |
| 9,176,547 B2 | 11/2015 | Attlesey |
| 9,223,360 B2 | 12/2015 | Attlesey |
| 9,426,927 B2 | 8/2016 | Shafer et al. |
| 9,451,726 B2 | 9/2016 | Regimbal et al. |
| 9,504,190 B2 | 11/2016 | Best |
| 9,756,766 B2 | 9/2017 | Best |
| 9,801,313 B2 | 10/2017 | Peterson et al. |
| 9,844,167 B2 | 12/2017 | Peterson et al. |
| 9,913,402 B2 | 3/2018 | Shafer et al. |
| 9,918,408 B2 | 3/2018 | Regimbal et al. |
| 9,921,622 B2 | 3/2018 | Shelnutt et al. |
| 9,992,914 B2 | 6/2018 | Best et al. |
| 10,064,313 B2 | 8/2018 | Ishinabe |
| 10,123,453 B2 | 11/2018 | Saito |
| 10,123,463 B2 | 11/2018 | Best et al. |
| 10,194,559 B2 | 1/2019 | Saito |
| 10,212,849 B2 | 2/2019 | Matsumoto et al. |
| 10,219,415 B2 | 2/2019 | Wiley |
| 10,225,957 B2 | 3/2019 | Gao et al. |
| 10,257,963 B2 | 4/2019 | Ozyalcin et al. |
| 10,271,456 B2 | 4/2019 | Tufty et al. |
| 10,349,555 B2 | 7/2019 | Barragy et al. |
| 10,349,560 B2 | 7/2019 | Norton et al. |
| 10,390,458 B2 | 8/2019 | Tufty et al. |
| 10,405,457 B2 | 9/2019 | Boyd et al. |
| 10,512,192 B2 | 12/2019 | Miyoshi |
| 10,609,839 B1 | 3/2020 | Archer et al. |
| 10,624,242 B2 | 4/2020 | Best |
| 10,645,841 B1 | 5/2020 | Mao et al. |
| 10,750,637 B1 | 8/2020 | Alissa et al. |
| 10,820,446 B2 | 10/2020 | Boyd et al. |
| 10,866,144 B2 | 12/2020 | Nayak et al. |
| 10,871,807 B2 | 12/2020 | Best et al. |
| 10,928,867 B2 | 2/2021 | Slaby et al. |
| 10,966,349 B1 | 3/2021 | Lau |
| 11,602,075 B2 | 3/2023 | Zhong |
| 11,849,565 B2 | 12/2023 | Gao |
| 2006/0090881 A1 | 5/2006 | Tuma |
| 2006/0126292 A1 | 6/2006 | Pfahni |
| 2008/0013276 A1 | 1/2008 | Pyle |
| 2008/0017355 A1 | 1/2008 | Attlesey et al. |
| 2008/0192389 A1 | 8/2008 | Muench et al. |
| 2011/0069453 A1* | 3/2011 | Campbell .............. H05K 7/203 361/700 |
| 2011/0120673 A1 | 5/2011 | Xiang et al. |
| 2014/0211412 A1 | 7/2014 | Best |
| 2015/0041414 A1* | 2/2015 | Squillante .............. B01D 35/18 210/774 |
| 2015/0043165 A1 | 2/2015 | Best et al. |
| 2016/0234970 A1 | 8/2016 | Shellnut et al. |
| 2017/0280587 A1 | 9/2017 | Watanabe et al. |
| 2017/0354061 A1* | 12/2017 | Saito ....................... G06F 1/206 |
| 2019/0124790 A1 | 4/2019 | Tufty et al. |
| 2019/0219311 A1* | 7/2019 | Smith ................. H05K 7/20236 |
| 2019/0281727 A1* | 9/2019 | Fujiwara ............ H05K 7/20236 |
| 2019/0364693 A1* | 11/2019 | Nishiyama ......... H05K 7/20236 |
| 2020/0025451 A1 | 1/2020 | Stone et al. |
| 2020/0089293 A1* | 3/2020 | Enright .............. H05K 7/20818 |
| 2020/0107470 A1 | 4/2020 | Archer et al. |
| 2021/0153390 A1 | 5/2021 | Tufty et al. |
| 2022/0003433 A1* | 1/2022 | Lee .......................... F28F 1/022 |
| 2022/0361381 A1* | 11/2022 | Sweeney ............ H05K 7/20781 |
| 2022/0400577 A1* | 12/2022 | Smith ................. H05K 7/20236 |
| 2022/0400584 A1* | 12/2022 | Enright .............. H05K 7/20327 |
| 2023/0042343 A1* | 2/2023 | Hashimoto ........ H05K 7/20272 |
| 2023/0080447 A1* | 3/2023 | Shah ................... H05K 7/20836 361/679.53 |
| 2023/0235270 A1 | 7/2023 | Laurent et al. |

FOREIGN PATENT DOCUMENTS

| | | |
|---|---|---|
| WO | 2010058154 | 5/2010 |
| WO | 2019006437 | 1/2019 |

OTHER PUBLICATIONS

R. C. Chu, R. E. Simons, M. J. Ellsworth, R. R. Schmidt and V. Cozzolino, "Review of cooling technologies for computer products," in IEEE Transactions on Device and Materials Reliability, vol. 4, No. 4, pp. 568-585, Dec. 2004, doi: 10.1109/TDMR.2004.840855.

Liu, C.; Yu, H. Evaluation and Optimization of a Two-Phase Liquid-Immersion Cooling System for Data Centers. Energies 2021, 14, 1395. https://doi.org/10.3390/en14051395.

Midas Green Tech, "Data Center Immersion Cooling" Retrieved from https://www.slideserve.com/gita/data-center-immersion-cooling on Apr. 22, 2023.

Green Revolution Cooling, "Technology", Retrieved from https://web.archive.org/web/20110201123746/http://www.grcooling.com/?page_id=70 on Aug. 10, 2023.

Green Revolution Cooling "CarnotJet" Retrieved from https://web.archive.org/web/20100806071410/http://www.grcooling.com/?page_id=6 on Aug. 10, 2023.

Non Final Office Action issued by the U.S. Patent Office in U.S. Appl. No. 17/982,341 dated Aug. 5, 2024.

* cited by examiner

FLUID CIRCULATION SYSTEMS AND METHODS FOR COOLING HAVING A COLLECTOR

CROSS-REFERENCE TO RELATED APPLICATION

The present application claims priority to U.S. Provisional Application No. 63/277,160, filed Nov. 8, 2021, which is hereby incorporated by reference.

BACKGROUND

Computing devices generate heat during operation. Thermal management systems may be used to dissipate heat that is generated by the computing devices.

SUMMARY

Embodiments described herein relate to fluid circulation systems and methods for cooling a plurality of computing devices with a dielectric fluid. Example fluid circulation systems described herein have a collector including cavities and a plate. The plate includes perforations that provide fluid access for moving the fluid from one cavity to another cavity. Beneficially, embodiments described herein may improve the heat transfer performance of the fluid circulation system.

In a first aspect, a fluid circulation system for cooling a plurality of computing devices with a dielectric fluid is disclosed. The fluid circulation system includes a fluid tank, a cooler, and a collector. The fluid tank includes a bottom having a plurality of apertures for receiving the dielectric fluid. The fluid tank is configured to hold the plurality of computing devices with a first computing device of the plurality of computing devices disposed over a first group of the apertures of the plurality of apertures. The cooler is configured to receive the dielectric fluid and remove thermal energy from the dielectric fluid. The collector includes a first cavity, a second cavity, a plate separating the first cavity from the second cavity, a collector inlet that opens into the first cavity and is configured to supply dielectric fluid into the collector, and a collector outlet. The plate is disposed at an angle such that a portion of the first cavity is positioned above a portion of the second cavity. The plate includes a plurality of perforations that provide fluid access for moving the dielectric fluid from the first cavity to the second cavity. The fluid tank, cooler, and collector are fluidly connected in a fluid circuit.

In an embodiment of the fluid circulation system, a first fluid path through the collector extends from the collector inlet, through the first cavity, through the plurality of perforations of the plate, through the second cavity, and to the collector outlet.

In another embodiment of the fluid circulation system, a cross-sectional area of the first cavity at an opening of the collector inlet is substantially greater than a cross-sectional area of the collector inlet so as to reduce a velocity of dielectric fluid entering the collector.

In another embodiment the fluid circulation system, the collector further includes a filtering chamber disposed under at least a portion of the first cavity and below the collector inlet.

In another embodiment of the fluid circulation system, a second fluid path through the collector extends from the collector inlet, through the first cavity, through the filtering chamber, and to a filter outlet.

In another embodiment of the fluid circulation system, the filter outlet is coupled to a filter, and the filter is coupled to a return configured to return dielectric fluid to the second cavity of the collector.

In another embodiment of the fluid circulation system, a majority of the plurality of perforations of the plate are disposed above the collector inlet so as to direct dielectric fluid in the first cavity upward and promote bubble dissipation in the first cavity.

In another embodiment of the fluid circulation system, one perforation of the plurality of perforations of the plate is smaller than one aperture of the plurality of apertures of the bottom of the fluid tank.

In another embodiment of the fluid circulation system, the system includes a pump configured to circulate the dielectric fluid through the fluid circuit.

In another embodiment of the fluid circulation system, the pump is disposed between the collector and the cooler.

In another embodiment of the fluid circulation system, the collector further includes a third cavity, a second plate separating the third cavity from the second cavity, and a second collector inlet that opens into the third cavity. The second plate is disposed at an angle such that a portion of the third cavity is positioned above a portion of the second cavity, and the second plate includes a plurality of perforations that provide fluid access for moving the dielectric from the first cavity to the second cavity.

In another embodiment of the fluid circulation system, the fluid tank is one of a plurality of fluid tanks including a second fluid tank, and a circulation path through the fluid circulation system comprises, in sequence, the plurality of fluid tanks, the collector, and the cooler.

In another embodiment of the fluid circulation system, the second collector inlet is opposite the collector inlet.

In another embodiment of the fluid circulation system, the plate and the second plate are oriented at opposite angles over the second cavity, and an upper end of the second plate contacts an upper end of the plate.

In another embodiment of the fluid circulation system, the fluid tank has an open volume.

In another aspect, a method of cooling a plurality of computing devices in a fluid circulation system is disclosed. The method includes pumping a dielectric fluid through a fluid circulation system such that the dielectric fluid flows along a plurality of paths through portions of the fluid circulation system. The plurality of paths includes a cooling path flowing through a fluid tank holding a plurality of computing devices, a restoring path flowing through a collector, and a heat exchange path flowing through a cooler so as to remove thermal energy from the dielectric fluid. The cooling path extends into the fluid tank through a plurality of apertures in a bottom of the fluid tank and upward past the plurality of computing devices so as to receive thermal energy from the plurality of computing devices. The restoring path extends through a collector inlet into a first cavity of the collector, from the first cavity of the collector through a plurality of perforations in a plate into a second cavity of the collector, and from the second cavity of the collector to a collector outlet.

In an embodiment of the method, the dielectric fluid is pumped through the fluid circulation system in a circuit including, in sequence, the cooling path, the restoring path, and the heat exchange path.

In another embodiment of the method, the plurality of computing devices are submerged in the fluid tank.

In another embodiment of the method, bubbles in the dielectric fluid rise in the first cavity and flow out of the restoring path.

In another embodiment of the method, a cross-sectional area of the first cavity at an opening of the collector inlet is substantially greater than a cross-sectional area of the collector inlet so as to reduce a velocity of dielectric fluid entering the collector thereby causing solids in the dielectric fluid to fall in the first cavity and flow out of the restoring path.

These as well as other aspects, advantages, and alternatives will become apparent to those of ordinary skill in the art by reading the following detailed description with reference where appropriate to the accompanying drawings.

BRIEF DESCRIPTION OF THE DRAWINGS

The accompanying drawings are included to provide a further understanding of the systems and methods of the disclosure, and are incorporated in and constitute a part of this specification. The drawings are not necessarily to scale, and sizes of various elements may be changed for clarity. The drawings illustrate one or more embodiment(s) of the disclosure, and together with the description serve to explain the principles and operation of the disclosure. In the drawings, similar symbols typically identify similar components, unless context dictates otherwise.

DETAILED DESCRIPTION

The following detailed description describes various features and functions of the disclosed apparatus, system, and methods with reference to the accompanying figures. The illustrative apparatus, system, and method embodiments described herein are not meant to be limiting. It will be readily understood that certain aspects of the disclosed apparatus, system, and methods can be arranged and combined in a wide variety of different configurations, all of which are contemplated herein.

I. Introduction

An example fluid circulation system for cooling a plurality of computing devices with a dielectric fluid includes a fluid tank, a cooler, and a collector. The collector includes a first cavity, a second cavity, a plate separating the first cavity from the second cavity, a collector inlet that opens into the first cavity and is configured to supply dielectric fluid into the collector, and a collector outlet. The plate is positioned above a portion of the second cavity, and the plate includes a plurality of perforations that provide fluid access for moving the dielectric fluid from the first cavity to the second cavity. Beneficially, flowing dielectric fluid through the collector may reduce dissolved gases and the presence of bubbles in the dielectric fluid and/or reduce solids in fluid paths of the fluid circulation system.

An example method of cooling the plurality of computing device includes pumping dielectric fluid through a restoring path flowing through the collector. The restoring path extends through the collector inlet into the first cavity, from the first cavity through the plurality of perforations into the second cavity, and from the second cavity to the collector outlet.

II. Example Systems

Figure 1:
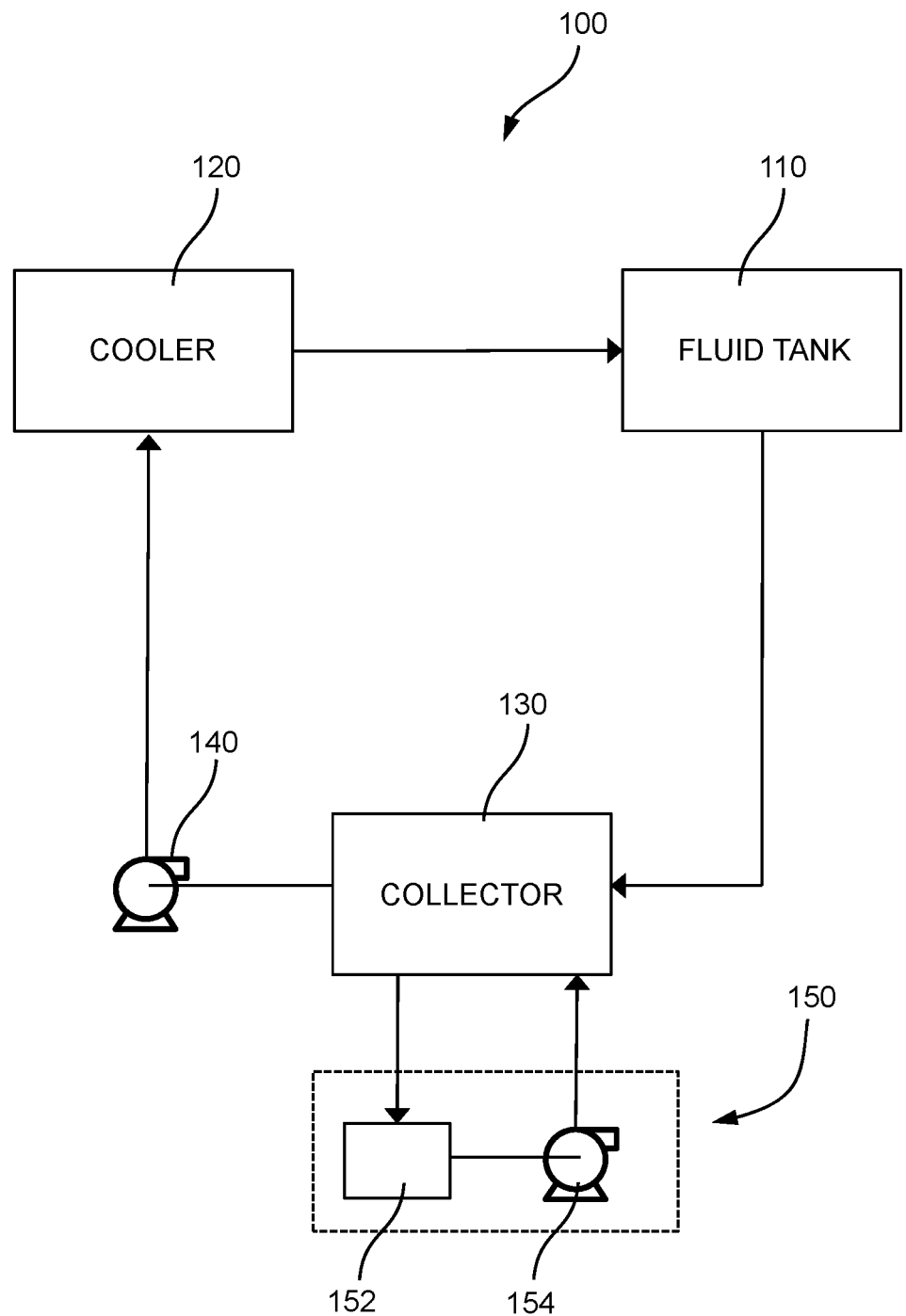
FIG. 1 is a schematic depiction of a fluid circulation system, according to an example embodiment.

FIG. 1 is a schematic depiction of a fluid circulation system 100, according to an example embodiment. The fluid circulation system 100 includes a fluid tank 110, a cooler 120, and a collector 130 fluidly connected in a fluid circuit. In the fluid circulation system 100, a dielectric fluid flows through at least the fluid tank 110, collector 130, and cooler 120. Fluid paths are as indicated in FIG. 1 and flow direction of a fluid in a given fluid path is indicated by one or more arrows. FIG. 1 is illustrative only and other fluids, components (e.g., piping, valves, seals, sensors), and/or fluid paths may be included in embodiments of a fluid circulation system.

The fluid tank 110 is configured to hold a plurality of computing devices. Dielectric fluid may flow through the fluid tank 110 to receive thermal energy from the plurality of computing devices. By receiving thermal energy from the plurality of computing devices, the dielectric fluid may cool the plurality of computing devices.

The cooler 120 is configured to receive dielectric fluid and remove thermal energy from the dielectric fluid. The dielectric fluid may flow through the cooler 120 so as to remove thermal energy from the dielectric fluid. In some embodiments, the cooler 120 includes a cooling tower configured to receive air to absorb thermal energy from the dielectric fluid. The cooling tower may transfer thermal energy from the dielectric fluid to atmospheric air. The cooler 120 may take the form of other components that serve a similar thermal purpose as well, including a heat exchanger. The heat exchanger, such as a shell-and-tube heat exchanger, may be configured to receive water or another liquid coolant to absorb thermal energy from the dielectric fluid.

The collector 130 is configured to receive dielectric fluid. As described herein, the collector 130 may restore the dielectric fluid so as to improve the heat transfer performance of the fluid circulation system 100. The collector 130 may be coupled downstream of the fluid tank 110 and upstream of the cooler 120. However, in other embodiments, the collector 130 may be arranged in different positions in the fluid circulation system 100, including downstream of the cooler 120 and upstream of the fluid tank 110.

The fluid circulation system 100 may also include a pump 140 configured to circulate dielectric fluid through at least the fluid tank 110, the cooler 120, and the collector 130. The pump 140 is fluidly connected to the fluid circuit. The pump 140 may be coupled downstream of the collector 130 and upstream of the cooler 120. However, in other embodiments, the pump 140 may be arranged in different positions in the fluid circulation system 100, including downstream of the cooler 120 and upstream of the fluid tank 110. The pump 140 may be formed by any actuator or mechanism that moves fluid, such as a rotary, piston, or other pumps. In some embodiments, the pump 140 may pump dielectric fluid through the fluid circulation system 100 at a constant speed or at variable speeds.

The fluid circulation system 100 may also include a filtering system 150 configured to filter dielectric fluid. The filtering system 150 is fluidly connected to the collector 130. The filtering system 150 includes a filter 152 and a pump 154. The filter 152 is configured to receive dielectric fluid and filter the dielectric fluid. The pump 154 is configured to circulate dielectric fluid through the collector 130 and the filter 152. The pump 154 may take the form of or be similar in form to the pump 140.

Although the fluid circulation system 100 is described above with respect to fluid tank 110, in some embodiments, fluid tank 110 is one of a plurality of fluid tanks. In some embodiments, the plurality of fluid tanks may include 6 fluid tanks, 12 fluid tanks, 18 fluid tanks, or 24 fluid tanks. Dielectric fluid may flow through at least the plurality of fluid tanks, collector 120, and collector 130. In some embodiments, a circulation path through the fluid circulation system 100 includes, in sequence, the plurality of fluid tanks, the collector, and the cooler. The term dielectric fluid, as used herein, includes various dielectric fluids that are known in the art and can suitably be used in the systems and methods described herein. For example, the dielectric fluids may be an oil-based dielectric, such as a hydrocarbon-based oil dielectric or silicone oil dielectric, and may have a dielectric strength above 40 kV at 2 mm.

Figure 2:
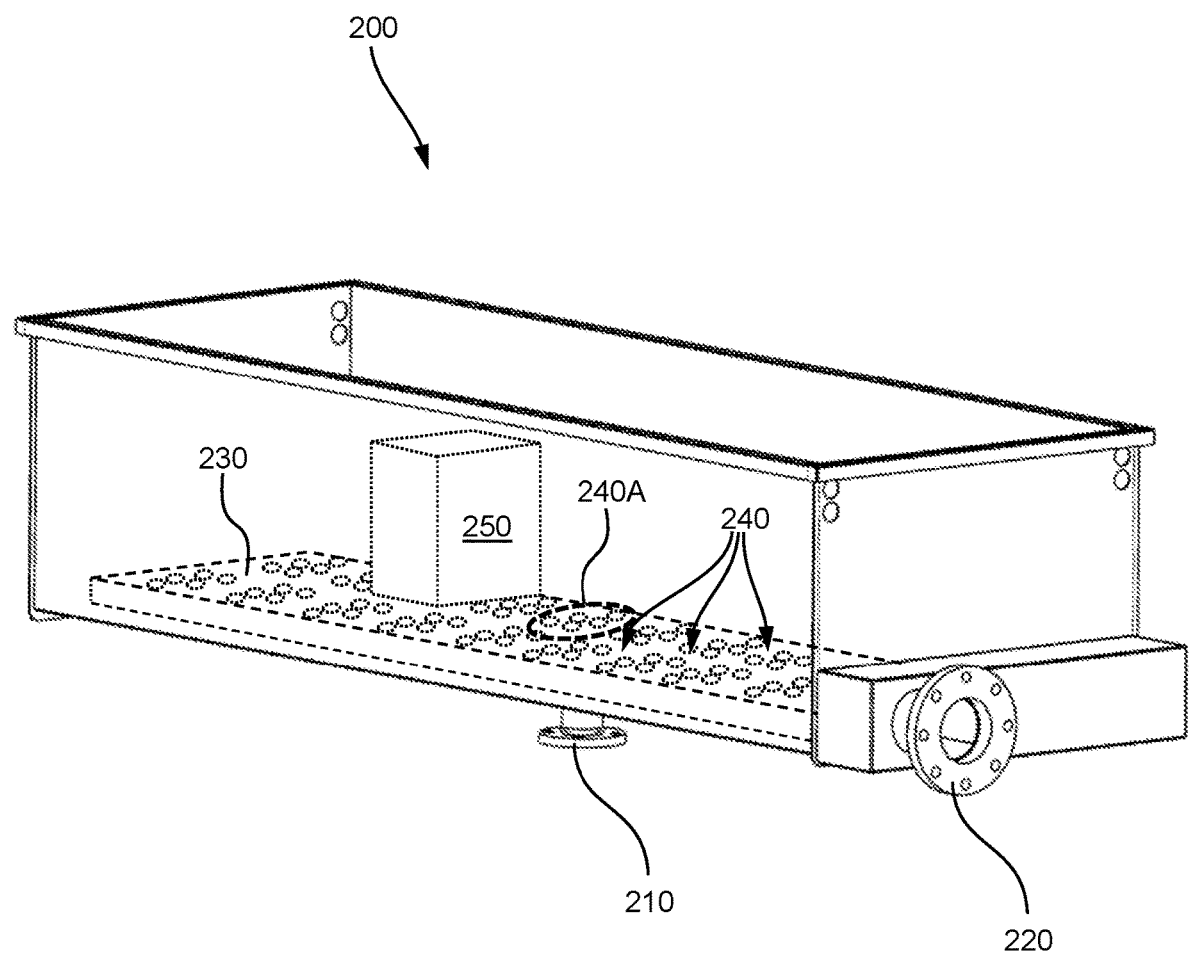
FIG. 2 is a perspective view of a fluid tank, according to an example embodiment.
Figure 2A:
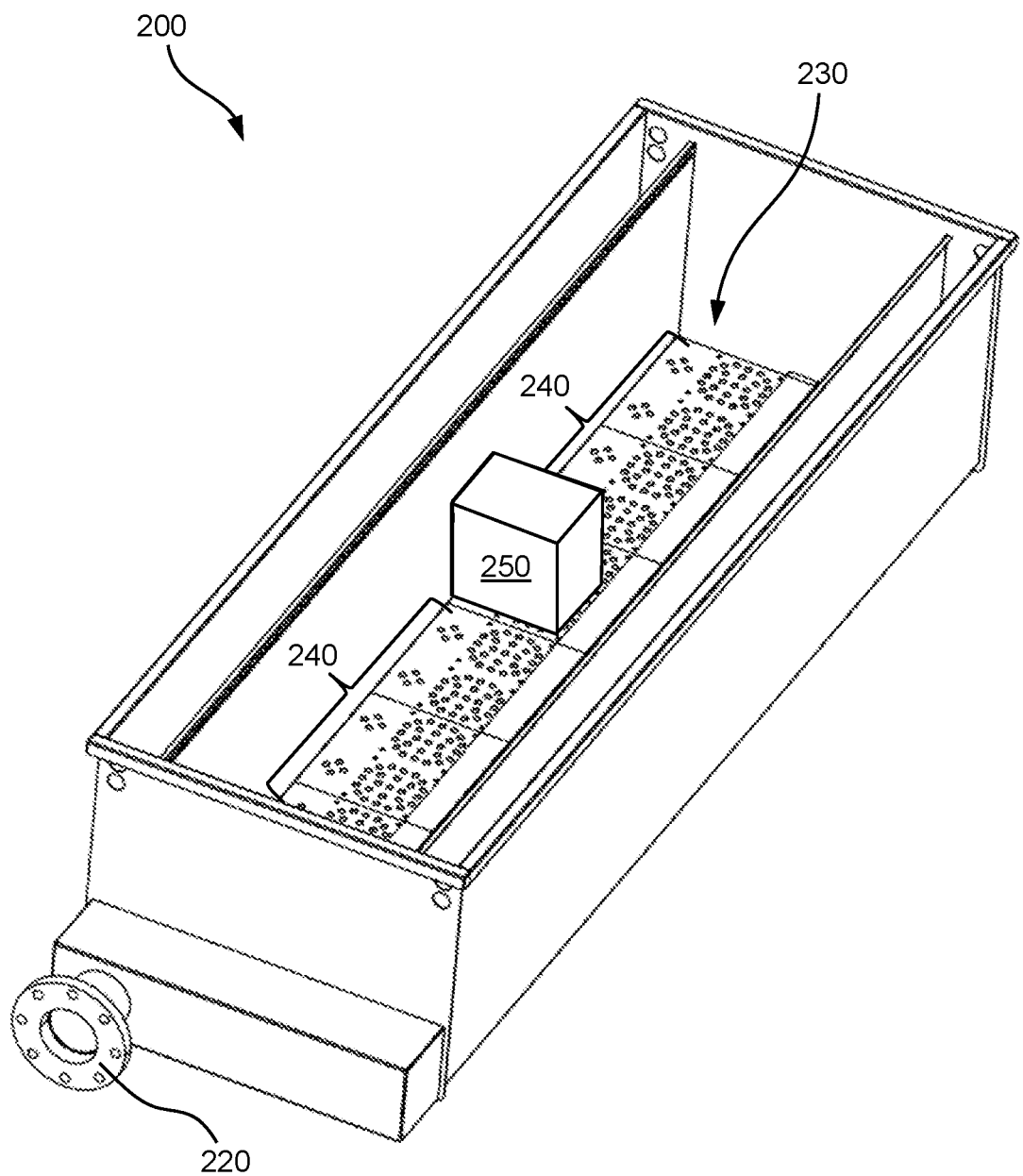
FIG. 2A is another perspective view of a fluid tank, according to an example embodiment.

FIG. 2 is a perspective view of a fluid tank 200, according to an example embodiment. The fluid tanks described herein may take the form of the fluid tank 200. The fluid tank 200 includes an inlet 210, an outlet 220, and a bottom 230. In some embodiments, the inlet 210 is coupled downstream of the cooler 120, and the outlet 220 is coupled upstream of the collector 130. However, in other embodiments, the inlet 210 and outlet 220 may be coupled to other components in the fluid circulation 100. In FIG. 2, a sidewall of the fluid tank 200 is removed for illustration. FIG. 2A is another perspective view of the fluid tank 200, according to an example embodiment.

The bottom 230 of the fluid tank 200 includes a plurality of apertures 240. The fluid tank 200 is configured to hold a plurality of computing devices. Groups of apertures of the plurality of apertures 240 may be associated with a particular computing device of the plurality of computing devices. In FIG. 2, a first computing device 250 of the plurality of computing devices is disposed over a first group of apertures of the plurality of apertures 240. A second group apertures 240A is shown in FIG. 2. The term computing device, as used herein, includes devices configured to execute software, including servers and desktop computers. Computing devices may include one or more processors, memory, and input/output connections.

In the fluid circulation system 100, dielectric fluid flows through the inlet 210 through the plurality of apertures 240 upward past the first computing device 250 and the other computing devices of the plurality of computing devices so as to receive thermal energy from the first computing device 250 and the other computer devices of the plurality of computing devices. The dielectric fluid, having received thermal energy from the plurality of computing devices, then flows through outlet 220.

The fluid tank 200 may have an open volume, and the plurality of computing devices may be submerged in the dielectric fluid. For example, in some embodiments, the plurality of computing devices may be fully submerged in the fluid tank 200. In other embodiments, at least one computing device of the plurality of computing devices, such as the first computing device 250, may be partially submerged in dielectric fluid. For example, the first computing device 250 may be partially submerged within the fluid tank 200.

In some embodiments, the plurality of apertures 240 may include between 5 to 10, 10 to 15, 15 to 20, 20 to 25, 25 to 30, or 30 to 35 groups of apertures. Other numbers of groups of apertures of the plurality of apertures are possible as well.

In some embodiments, the plurality of computing devices may include between 5 to 10, 10 to 15, 15 to 20, 20 to 25, 25 to 30, and 30 to 35 computing devices. Other numbers of computing devices in the plurality of computing devices are possible as well.

Figure 3:
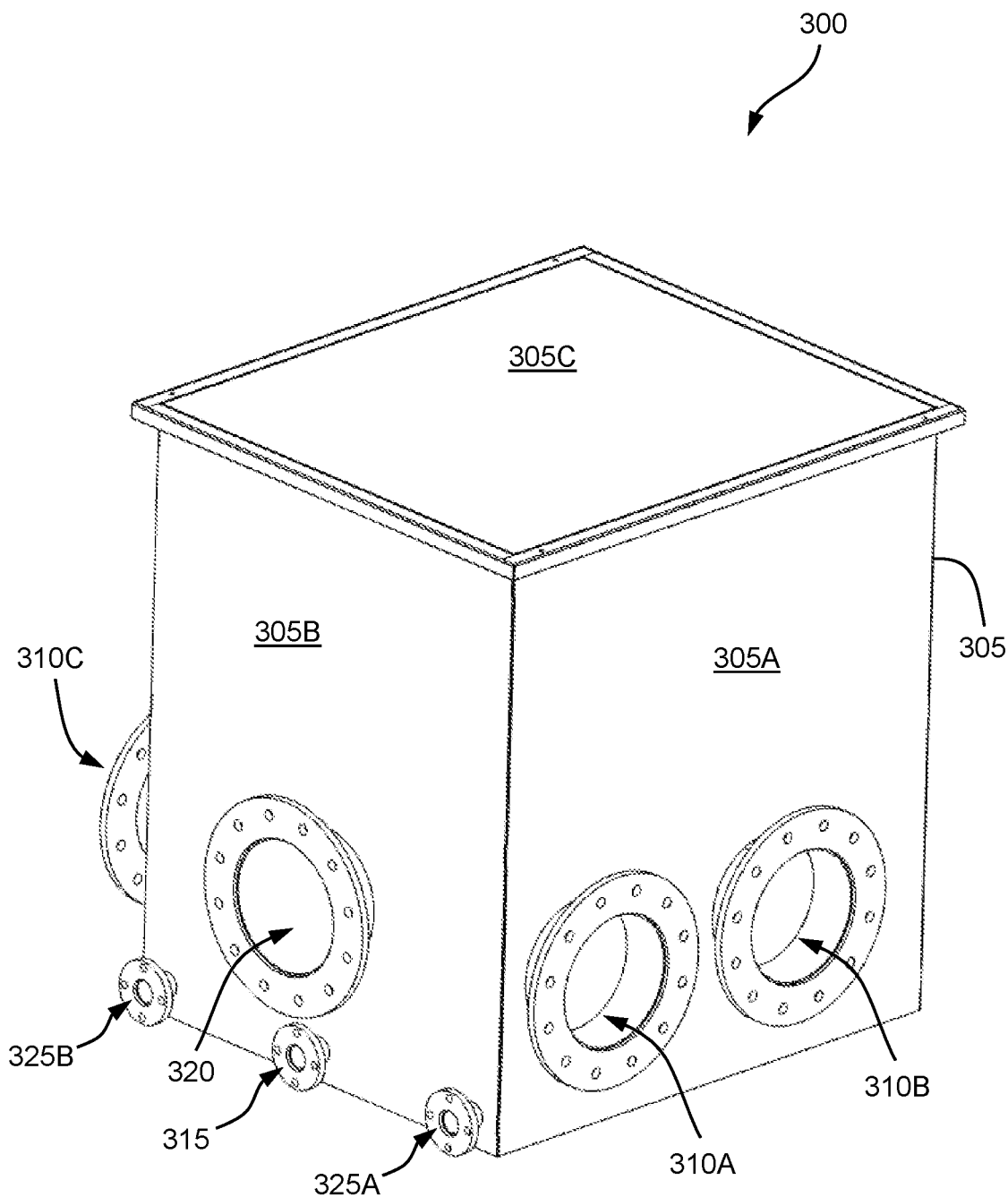
FIG. 3 is a perspective view of a collector, according to an example embodiment.
Figure 4:
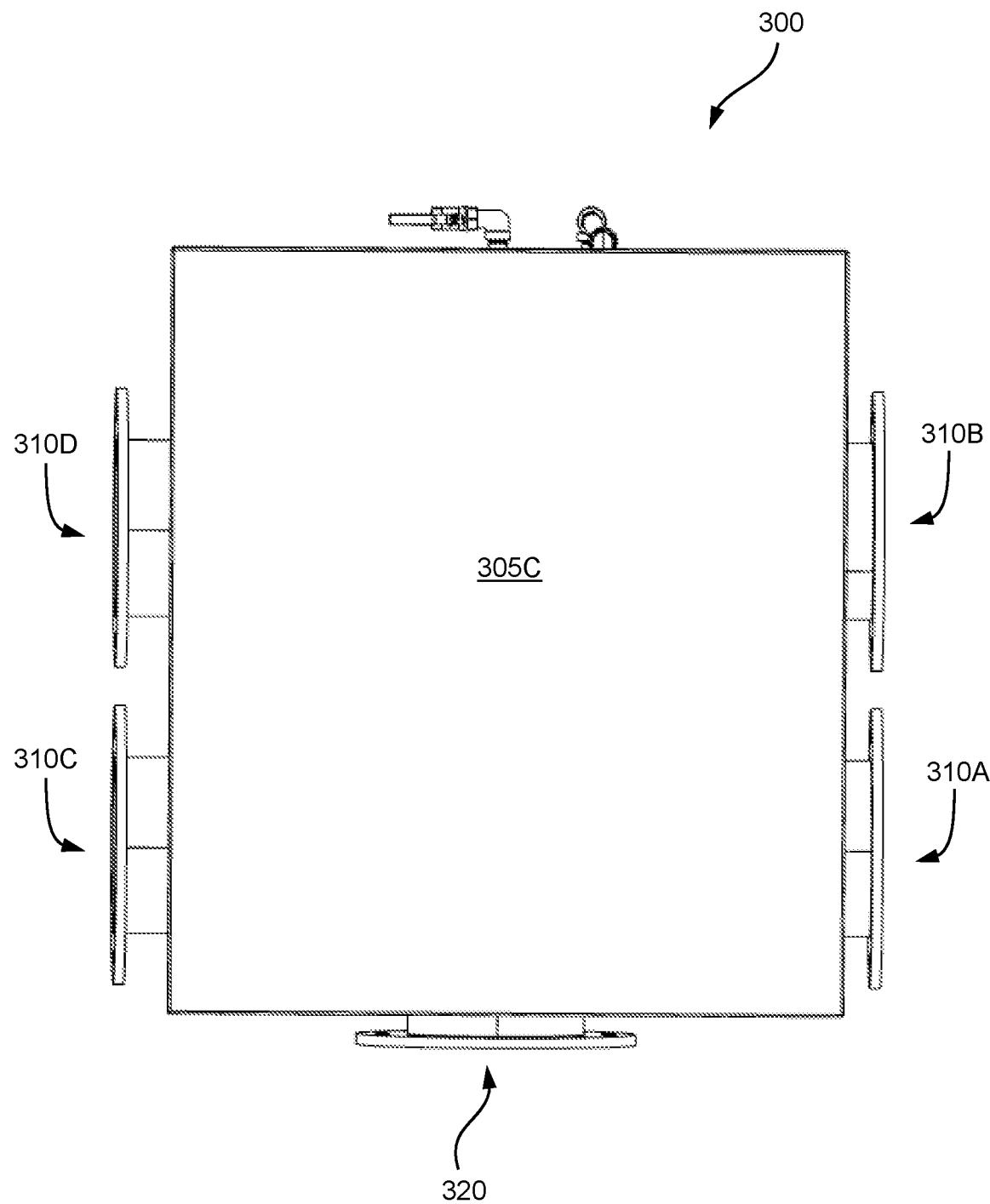
FIG. 4 is a top view of a collector shown in FIG. 3, according to an example embodiment.

FIG. 3 is a perspective view of a collector 300, according to an example embodiment. The collectors described herein may take the form of the collector 300. The collector 300 includes a housing 305, a collector inlet 310A, and a collector outlet 320. In some embodiments, the inlet 310A is coupled to the outlet 220 of the fluid tank 200, and the outlet 320 is coupled to the cooler 120. The inlet 310A may be configured to receive dielectric fluid with thermal energy from the plurality of computing devices. However, in other embodiments, the inlet 310A and outlet 320 may be coupled to other components of the fluid circulation system 100. The housing 305 may be a container having four sidewalls and a top. The first sidewall 305A, second sidewall 305B, and top 305C are shown in FIG. 3. FIG. 4 shows a top view of the collector 300, according to an example embodiment.

The collector 300 may also include a filter outlet 325A and a filter inlet 315. In some embodiments, the filter outlet 325A is coupled downstream of the inlet 310A and upstream of the filter system 150. The filter system 150 is configured to receive a portion of dielectric fluid via the filter outlet 325A and filter the portion of dielectric fluid. In some embodiments, the filter inlet 315 is coupled downstream of the filter system 150 and coupled to the outlet 320. The filter inlet 315 is configured to receive dielectric fluid filtered by the filter system 150 and convey the filtered dielectric electric fluid to the outlet 320.

Figure 5:
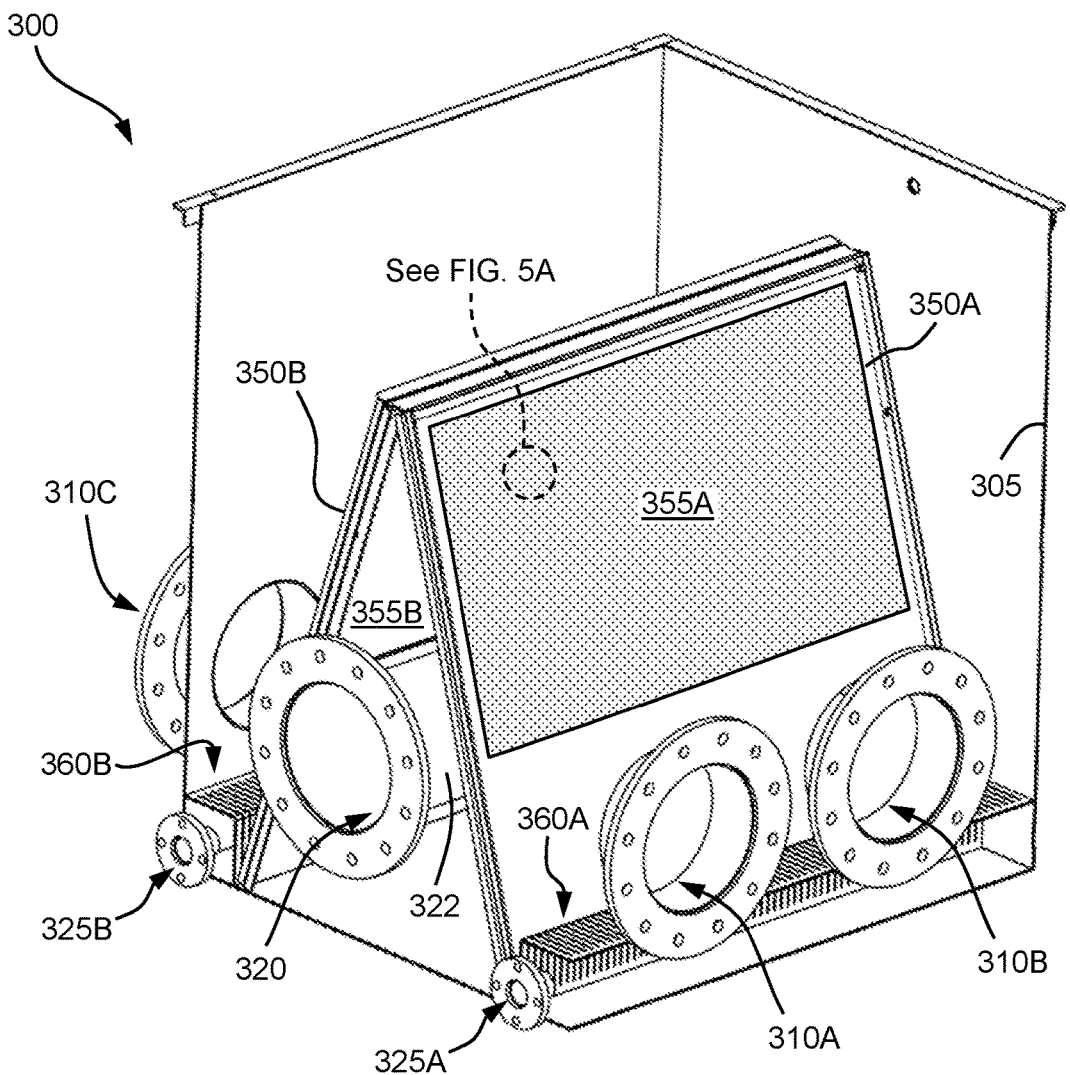
FIG. 5 is a perspective view of aspects of the collector shown in FIG. 3, according to an example embodiment.
Figure 5A:
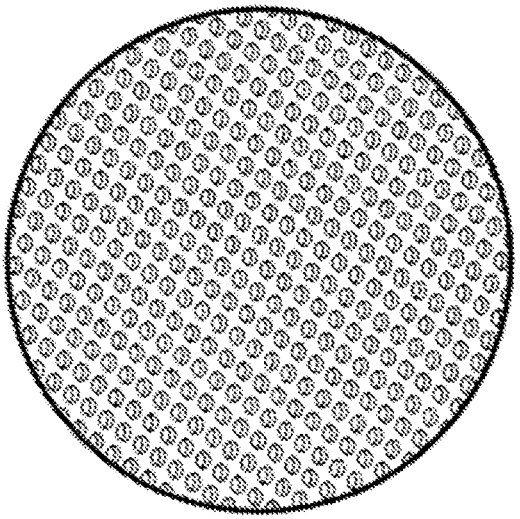
FIG. 5A is a detailed view of a portion of FIG. 5.
Figure 6:
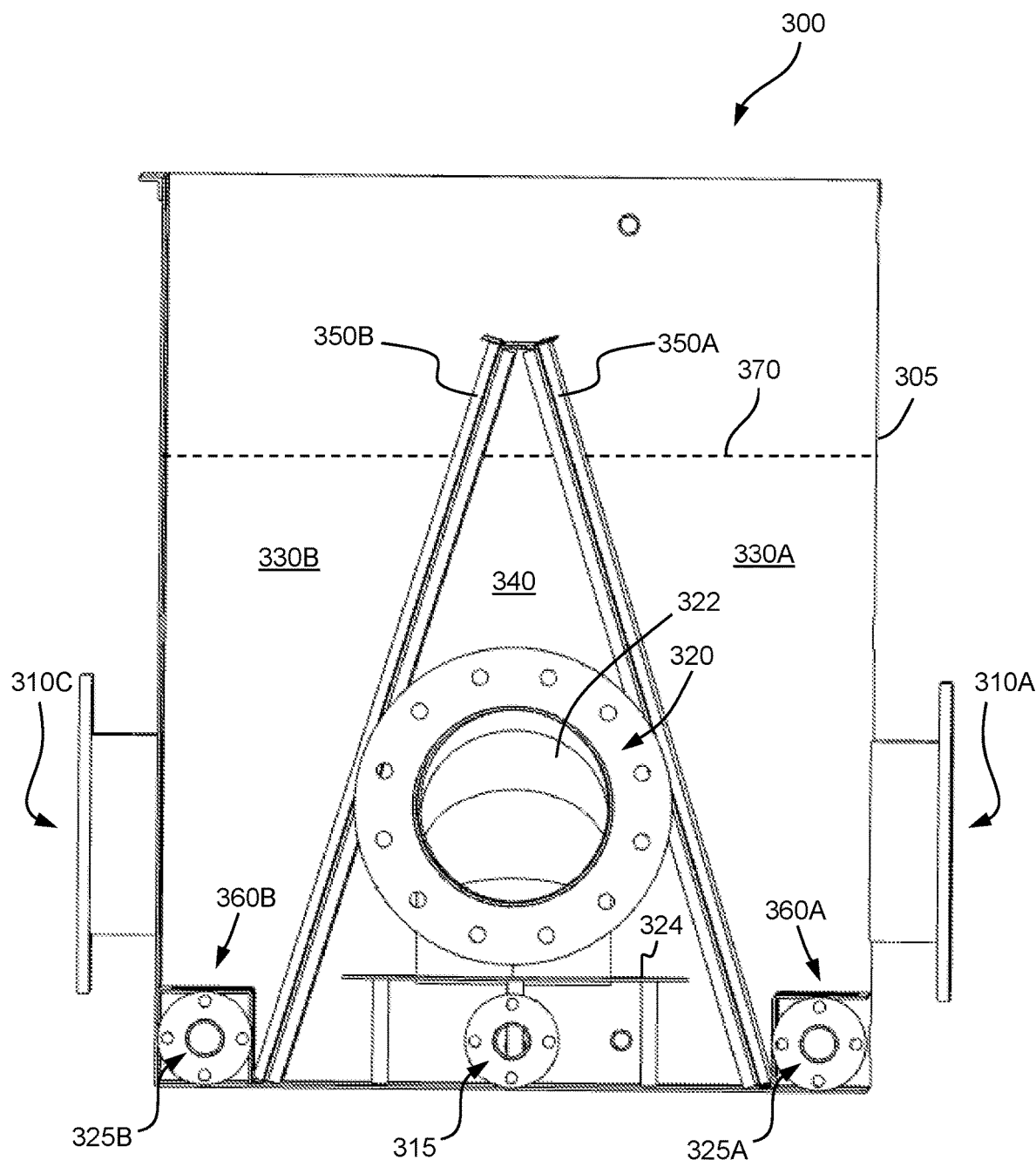
FIG. 6 is a front view of aspects of the collector shown in FIG. 3, according to an example embodiment.

FIGS. 5, 5A, and 6 show aspects of the collector 300, according to an example embodiment. FIG. 5 is a perspective view of aspects of the collector 300 in which first sidewall 305A, second sidewall 305B, and top 305C are removed for illustration. FIG. 6 is a front view of the collector 300 in which the second sidewall 305B is removed for illustration.

The collector 300 includes a first cavity 330A, a second cavity 340, and a plate 350A separating the first cavity 330A from the second cavity 340. The inlet 310A opens into the first cavity 330A and is configured to supply dielectric fluid into the collector 300.

The plate 350A is disposed at an angle such that a portion of the first cavity 330A is positioned above a portion of the second cavity 340. Further, the plate 350A includes a plurality of perforations 355A that provide fluid access for moving dielectric fluid from the first cavity 330A to the second cavity 340. FIG. 5A shows aspects of the plate 350A and the plurality of perforations 355A.

In some embodiments, a first fluid path through the collector 300 extends from the inlet 310A, through the first cavity 330A, through the plurality of perforations 355A, through the second cavity 340, and to the outlet 320. The collector 300 may also include piping 322 configured to convey dielectric fluid from the second cavity 340 to the outlet 320. The piping 322 may be referred to as a downspout. In some embodiments, dielectric fluid flowing through the plurality of perforations 355A and into the second cavity 340 contacts an outer surface of the piping 322.

Further, the collector 300 may also include a flange 324 at an end of the piping 322. The flange 324 may reduce formation of vortices as the dielectric fluid flows from the second cavity through the piping 322.

Moreover, in some embodiments, a cross-sectional area of the first cavity 330A at an opening of the inlet 310A is substantially greater than a cross-sectional area of the inlet 310A. For example, the cross-sectional area of the first cavity 330A may be at least 50% greater than the cross-sectional area of the opening of the inlet 310A, sometimes at least 100% greater, at least 200% greater, or more. As a result of this change in the cross-sectional area, the velocity of the dielectric fluid may substantially drop as it flows into the collector. The decrease in velocity helps any bubbles in the dielectric fluid to rise to the fluid surface, where they are dissipated. Likewise, the decrease in velocity also helps any solids that have accumulated in the dielectric fluid to fall out of the first fluid path and move toward the bottom of the first cavity 330A.

In some embodiments, a majority of the plurality of perforations 355A are disposed above the inlet 310A so as to direct dielectric fluid in the first cavity 330A upward before it passes through the perforations 355A in the plate 350A. This upward trajectory of the dielectric fluid may help remove bubbles from the dielectric fluid. For example, the rising fluid may carry the lighter bubbles upward initiating the rise of the bubbles. As the dielectric fluid flows through the first cavity 330A, the bubbles may continue to rise toward the liquid surface, where they are dissipated. Moreover, the rise of the dielectric fluid in the first cavity 330A, which results from the elevated position of the perforations 355A compared to the inlet 310A, also increases the length of the first fluid path through the first cavity 330A. Accordingly, any bubbles in the dielectric fluid have a longer opportunity to rise out of the dielectric fluid.

In some embodiments, one perforation of the plurality of perforations 355A is smaller than one aperture of the plurality of apertures 240. For example, one perforation of the plurality of perforations 355A may be 0.25 inch in diameter and one aperture of the plurality of apertures 240 may be 0.5 inch in diameter. Further, in some embodiments, the average size of the perforations 355A is smaller than the average size of the apertures 240. Likewise, in some embodiments, the majority of perforations 355A have a smaller size than the majority of apertures 240. Beneficially, where some perforations of the plurality of perforations 355A are smaller than some apertures of the plurality of apertures 240, the plurality of perforations 355A may function as a course filter media that does not impede flow of dielectric fluid to the pump 140. Further, in some embodiments, the plurality of perforations 355A have a mesh size of 60 wires per inch. In some such embodiments, the plurality of perforations 355A may increase nucleation of bubbles in the dielectric fluid.

Further, in some embodiments, a level 370 of dielectric fluid may be maintained in the collector 300 during operation of the collector. The level 370 may be between 12 to 24 inches, 24 to 36 inches, and 36 to 48 inches. In some embodiments, the collector 300 may be configured to receive a flow rate of dielectric fluid in a range from 300 GPM to 2000 GPM, such as 300 GPM to 900 GPM, 900 GPM to 1400 GPM, 1400 GPM to 2000 GPM, and 1000 GPM to 2000 GPM.

The collector 300 may also include a filter chamber 360A disposed under at least a portion of the first cavity 330A and below the inlet 310A. The filter chamber 360A is coupled to the filter outlet 325A. In some embodiments, a second fluid path through the collector 300 extends from the inlet 310A, through the first cavity 330A, through the filtering chamber 360A and to the filter outlet 325A. In some embodiments, solids in the dielectric fluid may be carried by the dielectric fluid through the second fluid path.

The collector 300 may also include other inlets, another cavity, another plate, another filter chamber, and another filter outlet. Additional inlets, cavity, plate, filter chamber, and filter outlet may enable the collector 300 to receive dielectric fluid from more fluid tanks. In the illustrated example, the collector 300 includes second collector inlet 310B, third collector inlet 310C, and fourth collector inlet 310D.

The third inlet 310C is opposite of the inlet 310A, and the third inlet 310C opens into a third cavity 330B and is configured to supply dielectric into the collector 300. The collector 300 may also include a second plate 350B that separates the third cavity 330B from the second cavity 340.

The second plate 350B is disposed at an angle such that a portion of the third cavity 330B is positioned above a portion of the second cavity 340. Further, the second plate 350B includes a plurality of perforations 355B that provide fluid access for moving dielectric fluid from the third cavity 330B to the second cavity 340.

In some embodiments, a third fluid path through the collector 300 extends from the third inlet 310C, through the third cavity 330B, through the plurality of perforations 355B, through the second cavity 340, and to the outlet 320.

Further, in some embodiments, a cross-sectional area of the third cavity 330B at an opening of the third inlet 310C is substantially greater than a cross-sectional area of the third inlet 310C so as to reduce a velocity of dielectric fluid entering the collector 300.

Moreover, in some embodiments, a majority of the plurality of perforations 355B are disposed above the third inlet 310C so as to direct dielectric fluid in the third cavity 330B upward and promote bubble dissipation in the third cavity 330B.

In some embodiments, the third inlet 310C, the third cavity 330B, the second plate 350B, and the plurality of perforations 355B may be the same as or similar to the inlet 310A, the first cavity 330A, the plate 350A, and the plurality of perforations 355A, respectively, and function in a similar manner, respectively. For example, the plate 350A and the second plate 350B may be oriented at opposite angles over the second cavity 340, and an upper end of the second plate 350B may contact an upper end of the plate 350A.

However, in other embodiments, the third inlet 310C may have a different size than the inlet 310A, the third cavity 330B may have a different size than the first cavity 330A, the second plate 350B may have a different size than the plate 350A, and the plurality of perforations 355B may have a different size than the plurality of perforations 355A. For example, the angle of the second plate 355B between the third cavity 330B and the second cavity 340 may be different than the angle of the plate 355A between the first cavity 330A and the second cavity 340.

The collector 300 may also include a filter chamber 360B disposed under at least a portion of the third cavity 330A and below the third inlet 310C. The filter chamber 360B is coupled to a filter outlet 325B. The filter outlet 325B in turn is coupled to filter system 150. In some embodiments, a fourth fluid path through the collector 300 extends from the third inlet 310C, through the third cavity 330B, through the filtering chamber 360B and to the filter outlet 325B. Further, in some embodiments, solids in the dielectric fluid may be carried by the dielectric fluid through the fourth fluid path.

In some embodiments, the filter chamber 360B and the filter outlet 325B may be the same as or similar to the filter chamber 360A and filter outlet 325A, respectively, and function in a similar manner, respectively. However, in other embodiments, the filter chamber 360B may have a different size than the filter chamber 360A, and the filter outlet 325B may have a different size than the filter outlet 325A.

Figure 7:
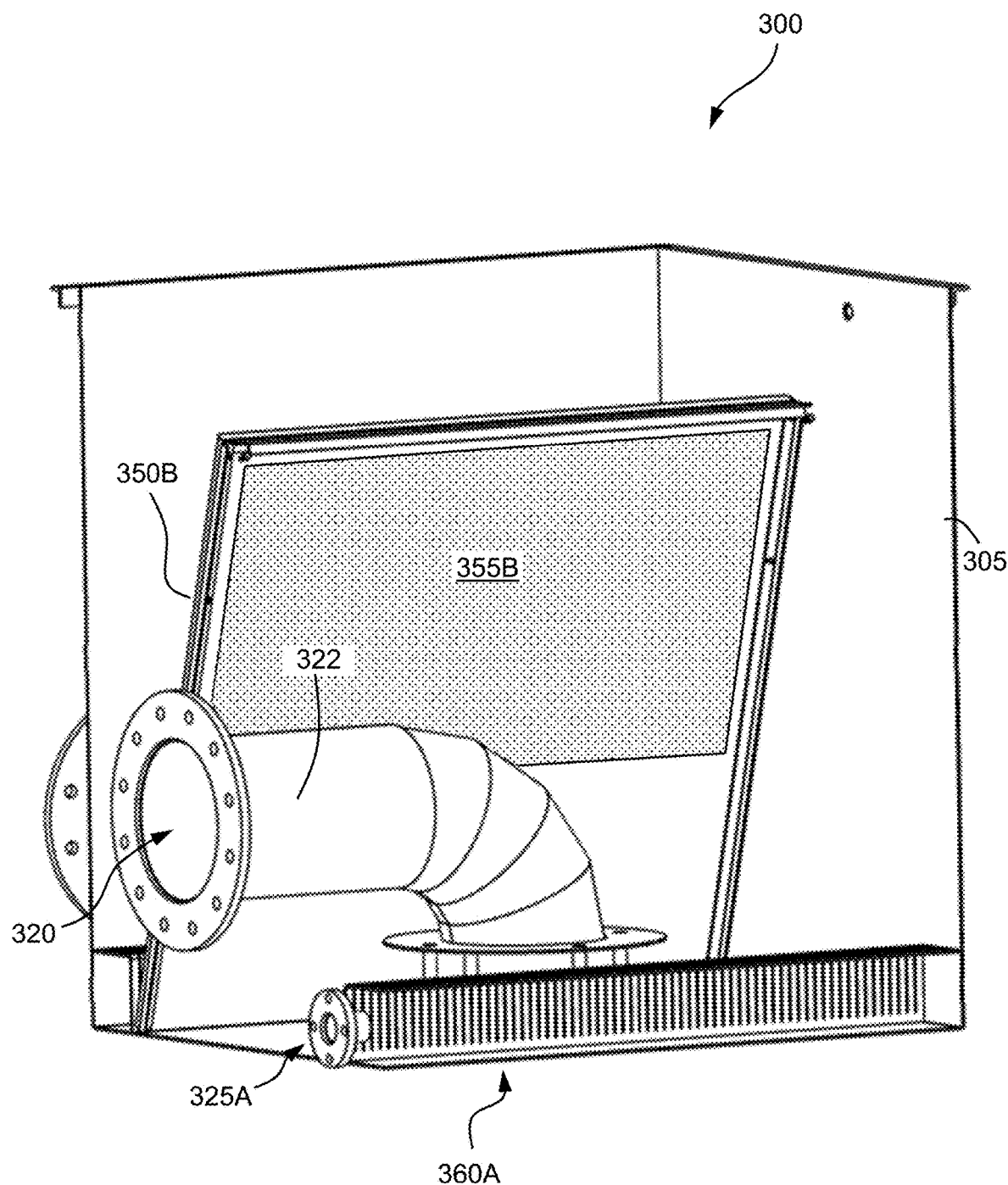
FIG. 7 is a perspective view of aspects of the collector shown in FIG. 3, according to an example embodiment.

FIG. 7 shows aspects of the collector 300, according to an example embodiment. FIG. 7 is a perspective view of aspects of the collector 300 in which the first sidewall 305A, inlets 310A and 310B, top 305C, and plate 350A are removed for illustration.

The second inlet 310B is parallel to the inlet 310A, and second inlet 310B opens into the first cavity 330A and is configured to supply dielectric fluid into the collector 300. The second inlet 310B may function the same as or similar to the inlet 310A. In some embodiments, the second inlet 310B may have the same size as the inlet 310A. However, in other embodiments, the second inlet 310B may have a different size than the inlet 310A.

In some embodiments, a fifth fluid path through the collector 300 extends from the second inlet 310B, through the first cavity 330A, through the plurality of perforations 355A, through the second cavity 340, and to the outlet 320.

In some embodiments, the filter chamber 360A is disposed below the second inlet 310B. Further, in some embodiments, a sixth fluid path through the collector 300 extends from the second inlet 310B, through the first cavity 330A, through the filtering chamber 360A and to the filter outlet 325A.

The fourth inlet 310D is parallel to the third inlet 310C, and the fourth inlet 310D opens into the third cavity 330B and is configured to supply dielectric fluid into the collector 300. The fourth inlet 310D may function the same as or similar to the third inlet 310C. In some embodiments, the fourth inlet 310D may have the same size as the third inlet 310C. However, in other embodiments, the fourth inlet 310D may have a different size than the third inlet 310C.

In some embodiments, a seventh fluid path through the collector 300 extends from the fourth inlet 310D, through the third cavity 330B, through the plurality of perforations 355B, through the second cavity 340, and to the outlet 320.

In some embodiments, the filter chamber 360B is disposed below the fourth inlet 310D. Further, in some embodiments, an eighth fluid path through the collector 300 extends from the fourth inlet 310D, through the third cavity 330B, through the filtering chamber 360B and to the filter outlet 325B.

In some embodiments, each of inlets 310A-310D is configured to receive dielectric fluid from multiple fluid tanks. For example, each of inlets 310A-310B may be coupled to two, four, six, or eight fluid tanks. Further, in some embodiments, each of inlets 310A-310D is coupled to the same number of fluid tanks. However, in other embodiments, at least one of inlets 310A-310D is coupled to more fluid tanks than the other inlets.

Figure 8:
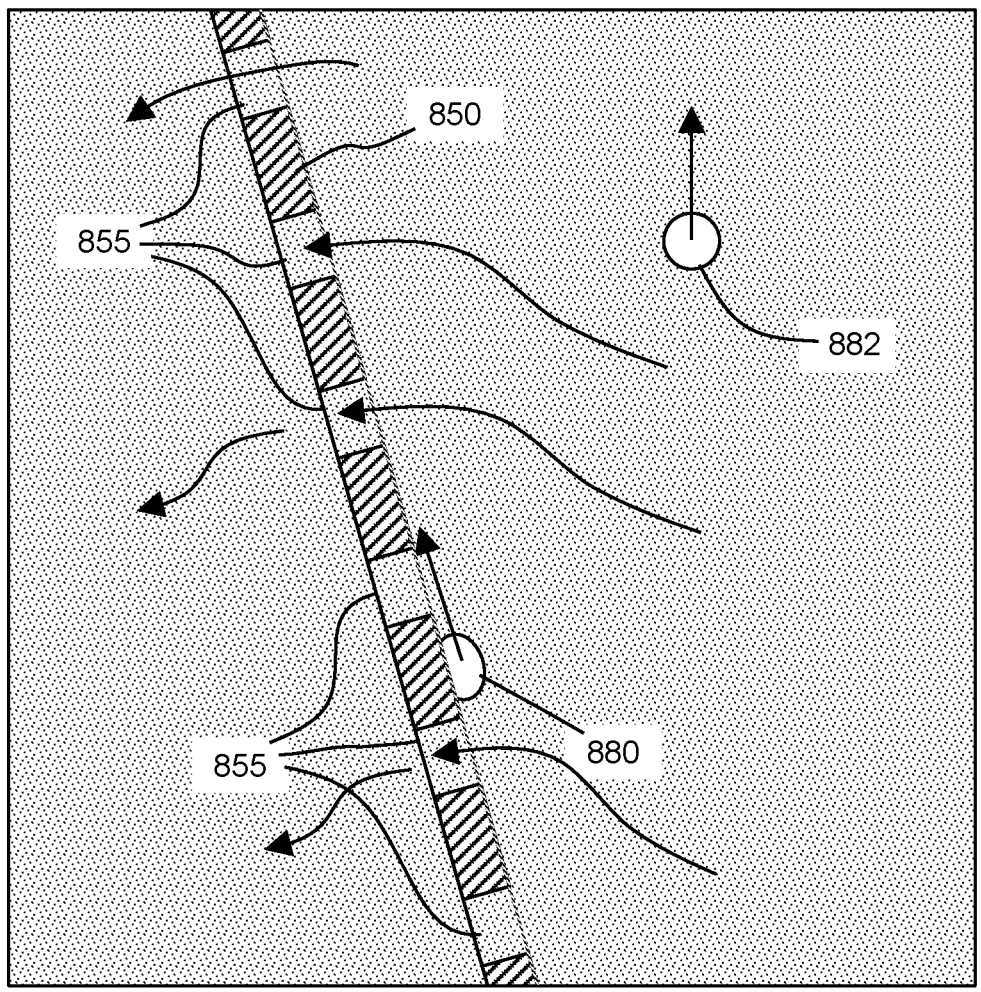
FIG. 8 is a schematic depiction of fluid flow on a plate, according to an example embodiment.

FIG. 8 is a schematic depiction of fluid flow through a plate 850 of a collector, according to an example embodiment. Dielectric fluid flow through plates 350A and 350B may take the form of the fluid flow depicted in FIG. 8. The plate 850 includes a plurality of perforations 855 that extend directly through the plate, i.e., in a direction perpendicular to the surface of the plate 850. Accordingly, because the plate 850 is disposed at an angle with respect to gravity, the perforations 855 include a downward trajectory through the plate 850. Thus, while the dielectric fluid easily flows through the perforations 855, as depicted by the arrows in FIG. 8, any bubbles in the dielectric fluid may be hindered from passing through the plate 850 as a result of their buoyancy. Specifically, the propensity of the bubbles to rise in the dielectric fluid will hinder the bubbles from flowing through the downward perforations 855. Rather, as shown by the example bubble 880, bubbles may tend to slide upward along the surface of the plate 850 until they detach or reach the fluid surface. Any bubbles that detach may be inclined to rise, as shown by example bubble 882. While the illustrated plates 350A, 350B of the example embodiments are disposed at angles in the collector, this phenomenon can also be achieved by angling the path of the perforations through the plate. For example, in some embodiments, the plate may be vertical and include perforations that may have a downward trajectory in the direction from the first cavity to the second cavity.

The reduction of dissolved gases and bubbles in the dielectric fluid resulting from the collector 300 may improve the heat transfer performance of the fluid circulation system 100. For example, reduction of dissolved gases and bubbles in the dielectric fluid may increase the amount of thermal energy the dielectric fluid may receive from the plurality of computing device. As another example, reduction of dissolved gases and bubbles in the dielectric fluid may reduce oxidation of the dielectric fluid, which may in turn increase the useful life of the dielectric fluid. As yet another example, reduction in dissolved gases and bubbles may in turn reduce turbulent flow through the pump 140 and/or reduce cavitation in the pump 140, which may improve the performance of the pump 140 and/or the useful life of the pump 140. The term useful life, as used herein, includes the time to repair or replace all or at least some of one component with a new component. Repairing or replacing a component of the fluid circulation system 100, including the dielectric fluid and pump 140, may involve downtime of the fluid circulation system 100.

The reduction of solids in the first and third fluid paths by the collector 300 may improve the heat transfer performance of the fluid circulation system 100. As examples, reduction in solids in the first fluid path may improve the useful life of the pump 140, improve the efficiency of the pump 140, increase the amount of thermal energy the dielectric fluid may receive from the plurality of computer devices, and/or increase the useful life of the dielectric fluid.

The above-described components of fluid circulation systems may be composed of a variety of different materials. For example, the components of the collector 300 described above may be formed of metal, such as aluminum or steel.

III. Example Methods

Methods for cooling a plurality of computing devices with a dielectric fluid may be carried out in whole or in part by a component or components of a fluid circulation system, such as the fluid circulation system 100. An example method may involve pumping a dielectric fluid through a fluid circulation system such that the dielectric fluid flows along a plurality of paths through portions of the fluid circulation system. The pump may take the form of the pump 140.

In an example method, the plurality of paths includes a cooling path, a restoring path, and a heat exchange path. In some embodiments, the dielectric fluid is pumped through the fluid circulation system in a circuit including, in sequence, the cooling path, the restoring path, and the heat exchange path.

In an example method, the cooling path flows through a fluid tank holding a plurality of computing devices, and the cooling path extends in the fluid tank through a plurality of apertures in a bottom of the fluid tank and upward past the plurality of computing devices so as to receive thermal energy from the plurality of computing devices. In some embodiments, the plurality of computing devices are submerged in the fluid tank. The fluid tank may take the form of the fluid tank 200, and the plurality of apertures may take the form of the plurality of apertures 240.

In an example method, the restoring path flows through a collector, and the restoring path extends through a collector inlet into a first cavity of the collector, from the first cavity of the collector through a plurality of perforations in a plate into a second cavity of the collector, and from the second cavity of the collector to a collector outlet. In some embodiments, bubbles in the dielectric fluid rise in the first cavity and flow out of the restoring path. Further, in some embodiments, a cross-sectional area of the first cavity at an opening of the collector inlet is substantially greater than a cross-sectional area of the collector inlet so as to reduce a velocity of dielectric fluid entering the collector thereby causing solids in the dielectric fluid to fall in the first cavity and flow out of the restoring path. The collector may take the form of the collector 300, the collector inlet may take the form of the inlet 310A, the inlet 310B, the inlet 310C, or the inlet 310D, the first cavity of the collector may take the form of the first cavity 330A or the first cavity 330B, the plurality of perforations in a plate may take the form of the plurality of perforations 355A in the plate 350A or the plurality of perforations 355B in the plate 350B, the second cavity of the collector may take the form of the second cavity 340, and the collector outlet may take the form of the outlet 320.

In an example method, the heat exchange path flows through a cooler so as to remove thermal energy from the dielectric fluid. The cooler may take the form of cooler 120.

The plurality of paths may also include a filtering path. In an example method, the filtering path extends through the first cavity in the collector to a filter chamber in the collector, from the filter chamber of the collector to a filter outlet of the collector, from the filter outlet of the collector to a filtering system, from the filtering system to a filter inlet of the collector, and from the filter inlet of the collector into the second cavity of the collector. The filter chamber may take the form of the filter chamber 360A or the filter chamber 360B, the filter outlet of the collector may take the form of the filter outlet 325A or the filter outlet 325B, the filtering system may take the form of filtering system 150, and the filter inlet of the collector may take the form of filter inlet 315.

IV. Conclusion

Although the disclosure has been described above in connection with specific embodiments, features of one embodiment may be employed with other embodiments as the skilled artisan would recognize, even if not explicitly stated herein.

Examples given above are merely illustrative and are not meant to be an exhaustive list of all possible embodiments, applications, or modifications of the disclosure. Thus, various modifications and variations of the described apparatus, system, and methods will be apparent to those skilled in the art without departing from the scope and spirit of the disclosure.

Any numerical values recited herein include all values from the lower value to the upper value in increments of one unit provided that there is a separation of at least two units between any lower value and any higher value. As an example, if it is stated that the value of a variable such as, for example, size, length, flow rate and the like, is, for example, from 1 to 90, specifically from 20 to 80, more specifically from 30 to 70, it is intended that values such as 15 to 85, 22 to 68, 43 to 51, 30 to 32, etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

The invention claimed is:

1. A fluid circulation system for cooling a plurality of computing devices with a dielectric fluid, the fluid circulation system comprising:
   a fluid tank comprising a bottom having a plurality of apertures for receiving the dielectric fluid, wherein the fluid tank is configured to hold the plurality of computing devices with a first computing device of the plurality of computing devices disposed over a first group of the apertures of the plurality of apertures;
   a cooler configured to receive the dielectric fluid and remove thermal energy from the dielectric fluid; and
   a collector comprising:
      a first cavity,
      a second cavity,
      a plate separating the first cavity from the second cavity, wherein the plate is disposed at an angle such that a portion of the first cavity is positioned above a portion of the second cavity, and wherein the plate includes a plurality of perforations that provide fluid access for moving the dielectric fluid from the first cavity to the second cavity,
      a collector inlet that opens into the first cavity and is configured to supply the dielectric fluid into the collector, and
      a collector outlet,
   wherein the fluid tank, the cooler, and the collector are fluidly connected in a fluid circuit.

2. The fluid circulation system of claim 1, wherein a first fluid path through the collector extends from the collector inlet, through the first cavity, through the plurality of perforations of the plate, through the second cavity, and to the collector outlet.

3. The fluid circulation system of claim 2, wherein a cross-sectional area of the first cavity at an opening of the collector inlet is greater than a cross-sectional area of the collector inlet so as to reduce velocity of the dielectric fluid entering the collector.

4. The fluid circulation system of claim 3, wherein the collector further comprises a filtering chamber disposed under at least a portion of the first cavity and below the collector inlet.

5. The fluid circulation system of claim 4, wherein a second fluid path through the collector extends from the collector inlet, through the first cavity, through the filtering chamber, and to a filter outlet.

6. The fluid circulation system of claim 5, wherein the filter outlet is coupled to a filter, and wherein the filter is coupled to a return configured to return the dielectric fluid to the second cavity of the collector.

7. The fluid circulation system of claim 2, wherein a majority of the plurality of perforations of the plate are disposed above the collector inlet so as to direct the dielectric fluid in the first cavity upward and promote bubble dissipation in the first cavity.

8. The fluid circulation system of claim 1, wherein one perforation of the plurality of perforations of the plate is smaller than one aperture of the plurality of apertures of the bottom of the fluid tank.

9. The fluid circulation system of claim 1, further comprising a pump configured to circulate the dielectric fluid through the fluid circuit.

10. The fluid circulation system of claim 9, wherein the pump is disposed between the collector and the cooler.

11. The fluid circulation system of claim 1, wherein the collector further comprises:
 a third cavity,
 a second plate separating the third cavity from the second cavity, wherein the second plate is disposed at an angle such that a portion of the third cavity is positioned above a portion of the second cavity, and wherein the second plate includes a plurality of perforations that provide fluid access for moving the dielectric fluid from the first cavity to the second cavity, and
 a second collector inlet that opens into the third cavity.

12. The fluid circulation system of claim 11, wherein the fluid tank is one of a plurality of fluid tanks including a second fluid tank, and wherein a circulation path through the fluid circulation system comprises, in sequence, the plurality of fluid tanks, the collector, and the cooler.

13. The fluid circulation system of claim 11, wherein the second collector inlet is opposite the collector inlet.

14. The fluid circulation system of claim 11, wherein the plate and the second plate are oriented at opposite angles over the second cavity, and wherein an upper end of the second plate contacts an upper end of the plate.

15. The fluid circulation system of claim 1, wherein the fluid tank has an open volume.

16. A method of cooling a plurality of computing devices in a fluid circulation system, the method comprising:
 pumping a dielectric fluid through the fluid circulation system such that the dielectric fluid flows along a plurality of paths through portions of the fluid circulation system, the plurality of paths including:
 a cooling path flowing through a fluid tank holding the plurality of computing devices, the cooling path extending into the fluid tank through a plurality of apertures in a bottom of the fluid tank and upward past the plurality of computing devices so as to receive thermal energy from the plurality of computing devices;
 a restoring path flowing through a collector, the restoring path extending through a collector inlet into a first cavity of the collector, from the first cavity of the collector through a plurality of perforations in a plate into a second cavity of the collector, and from the second cavity of the collector to a collector outlet; and
 a heat exchange path flowing through a cooler so as to remove thermal energy from the dielectric fluid.

17. The method of claim 16, wherein the dielectric fluid is pumped through the fluid circulation system in a circuit including, in sequence, the cooling path, the restoring path, and the heat exchange path.

18. The method of claim 16, wherein the plurality of computing devices are submerged in the fluid tank.

19. The method of claim 16, wherein bubbles in the dielectric fluid rise in the first cavity and flow out of the restoring path.

20. The method of claim 16, wherein a cross-sectional area of the first cavity at an opening of the collector inlet is greater than a cross-sectional area of the collector inlet so as to reduce velocity of the dielectric fluid entering the collector thereby causing solids in the dielectric fluid to fall in the first cavity and flow out of the restoring path.

* * * * *